United States Patent [19]
Hidese

[11] Patent Number: 5,338,381
[45] Date of Patent: Aug. 16, 1994

[54] APPARATUS AND METHOD FOR BONDING OUTER LEADS

[75] Inventor: Wataru Hidese, Ohikushino, Japan

[73] Assignee: Matsushita Electric Industrial Co., Ltd., Osaka, Japan; 03

[21] Appl. No.: 53,316

[22] Filed: Apr. 27, 1993

Related U.S. Application Data

[63] Continuation of Ser. No. 723,620, Jul. 1, 1991, abandoned.

[30] Foreign Application Priority Data

Jul. 6, 1990 [JP] Japan .................................. 2-180031

[51] Int. Cl.$^5$ ...................... B65G 25/00; B32B 31/00
[52] U.S. Cl. .................................... 156/64; 156/230;
156/351; 156/362; 156/363; 156/542; 156/566;
228/9; 228/105; 29/740
[58] Field of Search ................ 156/351, 361, 362, 363,
156/64, 230, 540, 541, 542, 566; 29/739, 740,
835; 228/8, 9, 102, 105

[56] References Cited

U.S. PATENT DOCUMENTS

| | | | |
|---|---|---|---|
| 3,909,933 | 10/1975 | Doubeck, Jr. et al. | 29/835 |
| 4,526,646 | 7/1985 | Suzuki et al. | 156/361 |
| 4,674,670 | 6/1987 | Watanabe et al. | 228/102 |
| 4,868,978 | 9/1989 | Seidel e al. | 29/740 |
| 4,896,418 | 1/1990 | Yearsley | 29/740 |

Primary Examiner—David A. Simmons
Assistant Examiner—J. Sells
Attorney, Agent, or Firm—Pollock, Vande Sande & Priddy

[57] ABSTRACT

A TAB method is known to manufacture an electrical component by bonding a semiconductor on a film carrier made of synthetic resin, then punching the lead of the film carrier, and bonding a device obtained by punching to a circuit board. A bonding of a semiconductor to a film carrier as described above is called "an inner lead bonding". Bonding a punched device to a circuit board is called "an outer lead bonding". In the invention, the film carrier fed from the supply reel is punched by a punching unit, and the device obtained by punching is picked up by a bonding head. Then, the positional deviation of the lead of the device picked up with respect to the electrode of the circuit board is detected by the optical means. Subsequently, the positional deviation of the lead is corrected, the device is placed on the circuit board, and the lead is fusion-bonded to the electrode of the circuit board.

5 Claims, 4 Drawing Sheets

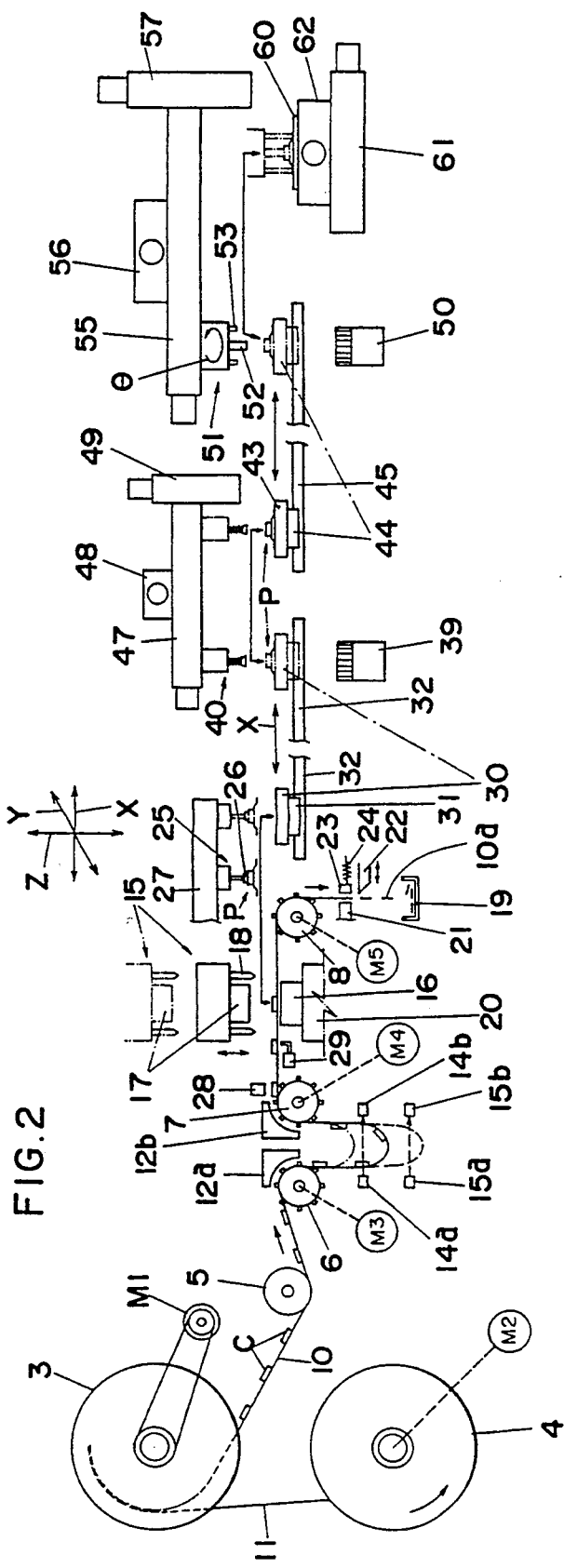
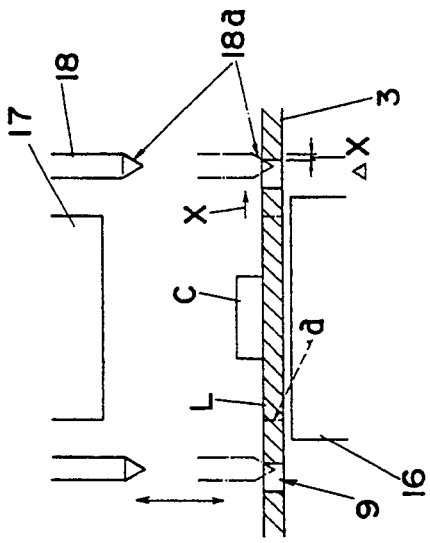
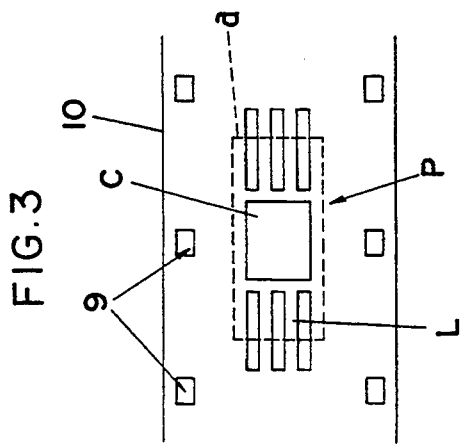

FIG.5
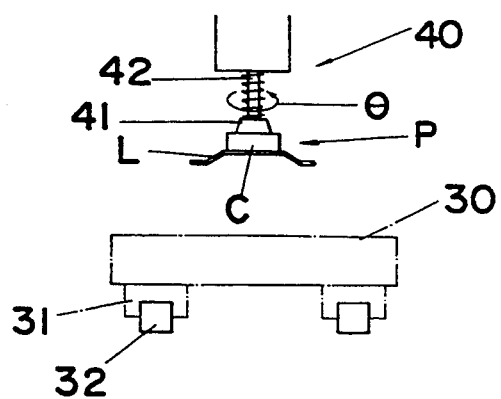
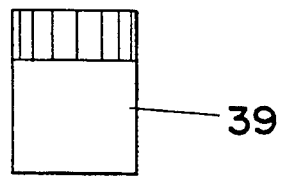
FIG.7
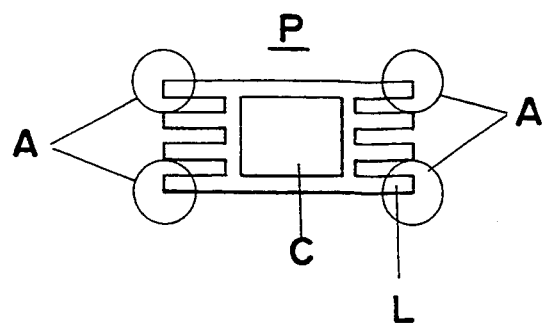
FIG.6
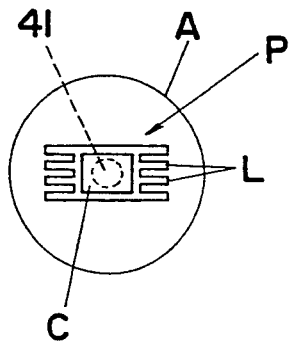
FIG.8
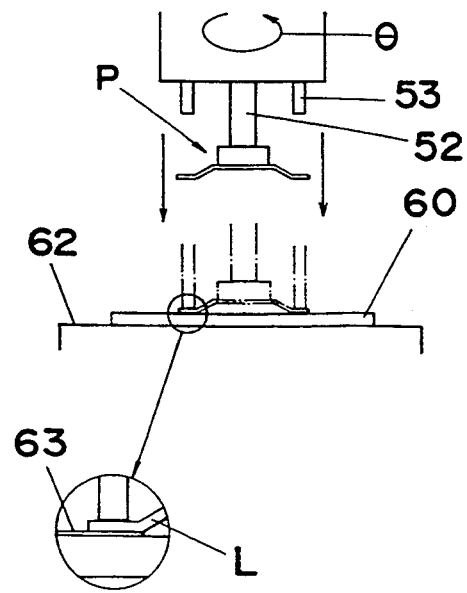

APPARATUS AND METHOD FOR BONDING OUTER LEADS

This application is a continuation of Ser. No. 07/723,620 filed on Jul. 1, 1991 abandoned.

BACKGROUND OF THE INVENTION

1. Field of the Invention

This invention relates to an apparatus for bonding an outer lead and a method of bonding an outer lead and, more particularly, to means for bonding a device formed of a film carrier to a circuit board.

2. Description of the Prior Art

A TAB method is known to manufacture an electrical component by bonding a semiconductor on a film carrier made of synthetic resin, then punching the lead of the film carrier, and bonding a device obtained by punching to a circuit board.

A bonding of a semiconductor to a film carrier as described above is called "an inner lead bonding". Bonding a punched device to a circuit board is called "an outer lead bonding".

Since the outer lead bonding must bond an extra fine lead by bringing the lead into coincidence with an extra fine electrode formed on a circuit board, its required mounting accuracy is remarkably high. Since the lead is formed of an extremely thin synthetic resin film, it is readily bent and deformed, and its operation is difficult. Therefore, an extremely enhanced technique is required for the outer lead bonding. Thus, outer lead bonding technique is not yet established.

SUMMARY OF THE INVENTION

Accordingly, an object of this invention is to provide outer lead bonding means which can automatically bond a lead to a circuit board.

In order to achieve this and other objects according to the present invention, there is provided an apparatus for bonding an outer lead comprising a supply reel for winding a film carrier bonded with a semiconductor, a punching unit for punching a lead of the film carrier fed from said supply reel, a bonding head for picking up a device obtained by punching the film carrier, bringing the lead of the device into coincidence with the electrode of a circuit board and placing the lead on the circuit board, fusion-bonding means for fusion-bonding the lead to the electrode of the circuit board, optical means for observing the lead of the device picked up by said bonding head to detect the positional deviation of the lead with respect to the electrode, and correcting means for relatively moving the device with respect to the circuit board to correct the positional deviation of the device.

With the arrangement described above, the film carrier fed from the supply reel is punched by the punching unit, and the device obtained by punching is picked up by the bonding head. Then, the positional deviation of the lead of the device picked up with respect to the electrode of the circuit board is detected by the optical means. Subsequently, the positional deviation of the lead is corrected, the device is placed on the circuit board, and the lead is fusion-bonded to the electrode of the circuit board.

These and other objects and features of the present invention will become apparent from the following detailed description in conjunction with the attached drawings.

BRIEF DESCRIPTION OF THE DRAWINGS

FIG. 2 is an overall view of an outer lead bonding system according to an embodiment of the present invention;

FIG. 3 is a plan view of a film carrier;

FIG. 4 is a side view of punching;

FIG. 5 is a side view of the system during observation;

FIGS. 6 and 7 are views of the system during observation; and

FIGS. 8 and 9 are a side view and a perspective view of the system during bonding.

DESCRIPTION OF THE PREFERRED EMBODIMENT

An embodiment of the present invention will now be described with reference to the accompanying drawings.

Figure 1:
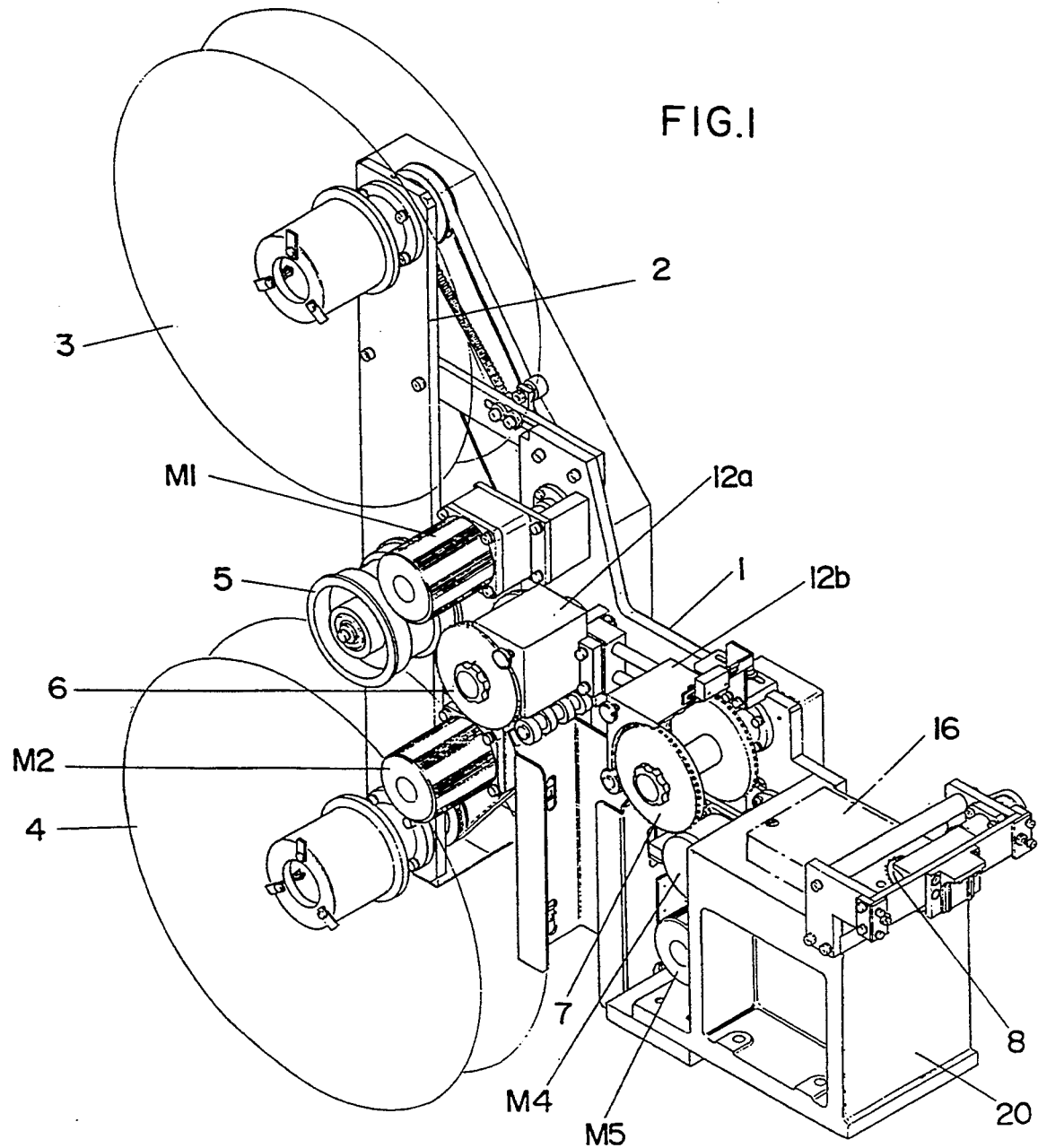
FIG. 1 is a perspective view of an apparatus for supplying a film carrier.

FIG. 1 is a perspective view of an apparatus for supplying a film carrier for use in an embodiment of an apparatus for bonding an outer lead of the present invention. Reference numeral 1 denotes a main frame; and 2, a bracket provided at the rear of the main frame 1. A supply reel 3 and a winding reel 4 are journaled at the upper and lower portions of the bracket 2. A guide roller 5 is provided in front of both the reels 3 and 4. Sprockets 6, 7 and 8 are provided further in front of the guide roller 5. A motor M1 for driving the supply reel 3, and a motor M2 for driving the winding reel 4 are also provided.

FIG. 2 is an overall view of an outer lead bonding system. A film carrier (hereinafter referred to as "a tape") 10 and an interlayer tape 11 are wound together on the supply reel 3. The interlayer tape 11 is wound on the winding reel 4 while feeding the tape 10 from the supply reel 3. FIG. 3 is a plan view of the tape 10. A semiconductor C is bonded to the tape 10 by inner lead bonding means. Leads L are provided on the tape 10. Pin holes 9 are perforated at the tape 10 for engaging pins of the sprockets 6, 7 and 8. As will be described in more detail, a device P obtained by punching the lead L by a punching unit 15 as illustrated by a broken line a is bonded to a circuit board via outer leads.

In FIG. 2, motors M3, M4 and M5 for driving the sprockets 6, 7 and 8 are provided. When the sprockets 6, 7 and 8 are pitch-rotated, the tape 10 is pitch-fed. Since the motors M3 and M4 are required to be controlled to be accurately rotated, pulse motors are employed. Cover means 12a and 12b are provided to prevent the tape 10 from floating from the sprockets 6 and 7 to be separated.

The tape 10 is hung down to provide a marginal length between the sprockets 6 and 7. Light emitting elements 14a and 14b, and light receiving elements 15a and 15b are provided as means for detecting the tape 10. When the tape 10 is raised as illustrated by a dotted broken line and the tape 10 is not detected by the light receiving element 14b, the rotating speed of the sprocket 6 is accelerated, or the rotating speed of the sprocket 7 is decelerated. When the tape 10 is detected by the light receiving element 15b as illustrated by a dotted broken line, the rotating speed of the sprocket 6 is decelerated, or the rotating speed of the sprocket 7 is accelerated. A suitable marginal length is provided to the tape 10 by regulating the marginal length of the tape 10 hung down between the sprockets 6 and 7.

A stage 20 is provided between the sprocket 7 and the sprocket 8. The punching unit 15 is provided at this stage 20. The punching unit 15 comprises a lower mold 16 placed on the stage 20 and a vertically movable upper mold 17. The tape 10 is pitch-fed horizontally between the sprocket 7 and the sprocket 8.

FIG. 4 shows the state that the tape 10 is punched as illustrated by the broken line a (see FIG. 3). A pin 18 is provided to vertically move up or down integrally with the upper mold 17. When the upper mold 17 is moved down, the pin 18 is first engaged with the pin hole 9. In this case, if there is a stopping position error $\Delta x$ of the tape 10 in its feeding direction, the end tapered surface 18a of the pin 18 is contacted with the edge of the pin hole 9 to slightly slide the tape 10 in a direction X to correct the error $\Delta x$, thereby positioning the tape 10 at the punching position. Then, when the upper mold 17 is further moved down, the lead L is punched at the tape 10. When the tape 10 is completely punched, the upper mold 17 is retracted upwardly so as not to disturb the pickup of feeding means 25 (to be described later in more detail).

In FIG. 2, photoelectric sensors 28 and 29 are provided above the sprocket 7 and at the side of the lower mold 16. The sensor 28 is adapted to confirm the presence or absence of the semiconductor C on the tape 10. More specifically, if the semiconductor C bonded to the tape 10 is improper, the semiconductor C is removed from the tape 10 before the tape 10 is wound on the supply reel 3, and a mark is formed at a position bonded with the semiconductor C of the tape 10 by opening a hole by punching or the like. Then, when the mark is detected by the sensor 28 as the mark is disposed above the stage 20, the sensor 28 outputs a command so that the punching unit 15 may not operate and the feeding means 25 (to be described later in more detail) does not pick up the device P. The sensor 29 is adapted to detect the pin hole 9 to confirm whether or not the tape 10 is correctly fed.

A stationary cutting edge 21 and a movable cutting edge 22 for constituting a cutter are provided. The tape 10 finished being punched as described above is circulated around the sprocket 8, and then cut by the cutting edges 21 and 22. The broken pieces 10a of the cut tape 10 are dropped in a box 19 to be recovered. A pressing member 23 is provided to elastically press the tape 10 to the stationary cutting edge 21 by the spring force of a spring member 24. The pressing member 23 prevents the tape 10 from being fluctuated when the tape 10 is cut.

A table 30 is provided in front of the sprocket 8. The table 30 slides on rails 32 through a slider 31. The feeding means 25 has a pad 26 for attracting the device P. The feeding means 25 reciprocates between the punching unit 15 and the table 30, attracts the device P obtained by punching the tape 10, and feeds it onto the table 30. A guide rail 27 is provided at the feeding means 25.

First optical means formed of a camera is provided under the right end of the rail 32. Second feeding means 40 for feeding the device P on the table 30 to a table 43 is provided. An attracting pad 41 and a shaft 42 are provided (see also FIG. 5). The feeding means 40 is attached to X- Y- Z-direction moving units 47, 48 and 40 to be moved in the directions X, Y and Z.

The optical means 39 observes the lead L of the device P picked up by the feeding means 40 from below. The first object for the observation of the optical means 39 is to roughly detect the position of the lead L so as to accurately introduce the lead L to the visual field of the second optical means 50 (to be described later in more detail). The second object is to detect the positional deviations in the directions X, Y and $\theta$ of the lead L with respect to a thermal fusion-bonding element 53 (to be described later in more detail). Therefore, the optical means 39 roughly observes the device P by reducing its magnification as shown in FIG. 6, its observation accuracy is considerably low and the optical means 39 cannot satisfy the required bonding accuracy of the lead. Reference character A denotes the visual field of the optical means 39.

The feeding means 40 feeds the device P from the table 30 to the table 43. In this case, it increases or decreases the moving strokes of the feeding means 40 in the directions X and Y and horizontally rotates the shaft 42 attracting the device P in the direction $\theta$ to thereby roughly correct the positional deviations of the lead L thus roughly detected by the optical means 39 in the directions X, Y and 8 and to then place the device P on the table 43.

In FIG. 2, the table 43 slides on the rail 45 through the slider 44. Second optical means 50 formed of a camera is provided under the right end of the rail 45, and a bonding head 51 for picking up the device P on the table 43 is provided. The bonding head 51 has a nozzle 52 for attracting the device P and a thermal fusion-bonding element 53 for thermally fusion-bonding the lead L to the electrode 63 of the circuit board. X-, y- and Z-direction moving units 55, 56 and 57 for moving the bonding head 51 in the directions X, Y and Z are provided.

The bonding head 51 picks up the device P on the table 43. In this case, it regulates the moving strokes of the bonding head 51 in the directions X and Y so as to correct the positional deviations of the lead roughly detected by the optical means 39 in the directions X, Y and $\theta$, and horizontally rotates the bonding head 51 in the direction $\theta$. When the positional deviations of the lead L in the directions X, Y and 0 are corrected as described above, the thermal fusion-bonding element 53 can be positioned directly on the lead L, and the device P can be picked up by the bonding head 51.

The optical means 50 is adapted to observe the lead L of the device P picked up by the bonding head 51. This observation is conducted to accurately detect the positional deviations of the lead L in the directions X, Y and $\theta$ so as to satisfy the required bonding accuracy. Therefore, as shown in FIG. 7, the magnification of the optical means 50 is raised to precisely observe the end of the lead L. In this case as described above, the positional deviation of the lead L is roughly detected by the first optical means 39, and the positional deviation is roughly corrected. Therefore, the end of the lead L can be reliably introduced into the visual field A of the optical means 50. The accurate measurement of the positional deviation of the lead L as described above may be executed by a laser device instead of the camera 50.

Figure 9:
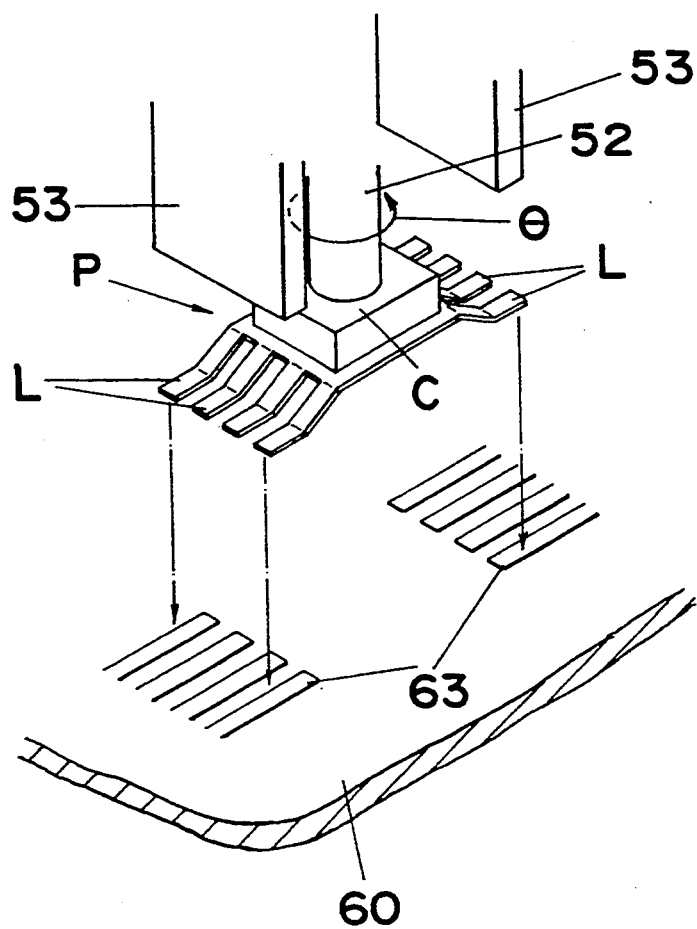

In FIG. 2, a circuit board 60 is positioned on X-Y tables 61 and 62. Electrodes 63 to be fusion-bonded with the leads L are formed on the circuit board 60. The electrodes 63 are formed extra fine by etching. The bonding head 51 brings the lead L into coincidence with the electrode 63 and places the device P on the circuit board 60 (see FIGS. 8 and 9). As described above, this bonding is called "an outer lead bonding". In this case, the thermal fusion-bonding element 53 moves vertically upward or downward, presses the lead L to the electrode 63, and thermally fusion-bond the lead L to the electrode 63. The lead L may be thermally fusion-bonded to the electrode 63 not by the thermal fusion-bonding element 53 but by irradiating a laser light to the lead L.

The positional deviations of the lead L detected by the optical means 50 in the directions X and Y are corrected by increasing or decreasing the moving strokes of the bonding head 51 in the directions X and Y. The positional deviation of the lead L in the direction $\theta$ is corrected by horizontally rotating the bonding head 51 in the direction $\theta$.

A method of correcting the positional deviations of the lead L in the directions X, Y and $\theta$ may be freely determined. More specifically, the positional deviation of the lead L in the direction $\theta$ may be corrected by horizontally rotating the circuit board 60. The positional deviations of the lead L in the directions X and Y may be corrected by driving the X-Y tables 61 and 62 to move the circuit board 60 in the directions X and Y. The positional deviations of the lead L in the directions X and Y may also be corrected by increasing or decreasing the moving strokes of the feeding means 40 for feeding the device P, or the moving strokes of the bonding head 51. Or, they may be corrected by moving the table 43 placing the device P or the circuit board 60 in the directions X and Y. The positional deviation of the lead L in the direction X may be corrected by moving the table 43 or the circuit board 60 in the same direction and the positional deviation of the lead L in the direction Y may be corrected by moving the feeding means 40, the bonding head 51 in the same direction.

According to the present invention as described above, the operations from the feeding of the tape 1 wound on the supply reel 3 to the bonding of the lead L to the circuit board 60 can be precisely executed as a series of operations with satisfactory operability so as to satisfy the required accuracy.

The present invention as described above constitutes the apparatus for bonding an outer lead comprising a supply reel for winding a film carrier bonded with a semiconductor, a punching unit for punching a lead of the film carrier fed from said supply reel, a bonding head for picking up a device obtained by punching the film carrier, bringing the lead of the device into coincidence with the electrode of a circuit board and placing the lead on the circuit board, fusion-bonding means for fusion-bonding the lead to the electrode of the circuit board, optical means for observing the lead of the device picked up by said bonding head to detect the positional deviation of the lead with respect to the electrode, and correcting means for relatively moving the device with respect to the circuit board to correct the positional deviation of the device. Therefore, the operation for feeding the tap from the supply reel, the tape punching operation, the operations of detecting and correcting the positional deviations of the lead, the lead bonding operation can be precisely executed as a series of operations with satisfactory operability so as to satisfy the required high accuracy.

What is claimed is:

1. A method of bonding an outer lead of device, comprising the steps of:
   (a) providing a film in which at least one semiconductor is included;
   (b) separating at least one lead of the film so as to produce a device;
   (c) transferring the device to a pick up position defined with respect to a bonding means;
   (d) detecting positional deviations of the device, with a first degree of precision, relative to a position of a fusion means during transfer of the device;
   (e) moving said bonding means relative to the device in accordance with the detected positional deviations, and picking up the device;
   (f) detecting positional deviations of the lead, with a greater degree of precision, relative to a position of an electrode of a circuit board during pick up of the device;
   (g) moving the device relative to the electrode of the circuit board so as to correct any positional deviation, and placing the device on the circuit board; and
   (h) fusion-bonding the lead to the electrode.

2. An apparatus for bonding an outer lead, comprising:
   a supply reel for winding a film carrier to which at least one semiconductor is bonded;
   a punching unit for punching at least one lead of said film carrier fed from said supply reel to produce a device;
   a bonding means including a pick up means and a fusion means;
   transfer means for transferring said device to a pick up position defined with respect to said bonding means;
   moving means for effecting said bonding means to pick up said device from said pick up position and to place said device on a circuit board, and for positioning the lead of said device into coincidence with an electrode of said circuit board;
   first optical means for detecting the positional deviations of the lead with a first degree of precision, relative to the position of said fusion means during transfer of said device by said transfer means, to assure the presence of the lead in the field of view of a camera positioned downstream of the first optical means;
   the camera, having a greater magnification than the first optical means, detecting the positional deviations of the lead, with a greater degree of precision, relative to the position of said fusion means during pick up of said device by said pick up means;
   positioning means for relatively moving said device with respect to said circuit board for correcting said any positional deviation to thereby enable said fusion means to accurately fusion bond the lead of said device to said electrode of said circuit board.

3. The apparatus of claim 2, said punching unit comprises a lower mold and an upper mold, said upper mold being provided with at least one pin for engagement with a pin hole in said film carrier.

4. The apparatus of claim 2, further comprising a cutter provided at a rear location of said punching unit.

5. A method of bonding an outer lead, comprising the steps of:
   (a) providing a film carrier to which at least one semiconductor is bonded from a supply reel;
   (b) punching at least one lead of said film carrier by a punching unit to produce a device;
   (c) transferring said device to a pick up position defined with respect to a bonding means;

(d) detecting the positional deviations of the lead, with a first degree of precision, relative to the position of said fusion means during transfer of said device to assure the presence of the lead within a preselected downstream field of view;

(e) moving said bonding means relative to said device in accordance with said detected positional deviations, and picking up said device;

(f) detecting, under increased observation magnification, the positional deviations of the lead in the field of view with a greater degree of precision, relative to the position of said fusion means during pick up of said device;

(g) moving said device relative to said electrode of said circuit board to correct said any positional deviation, and placing said device on said circuit board; and (h) fusion-bonding the lead to said electrode.

* * * * *